(12) United States Patent
Kolar et al.

(10) Patent No.: US 9,767,890 B2
(45) Date of Patent: Sep. 19, 2017

(54) OPERATION AWARE AUTO-FEEDBACK SRAM

(75) Inventors: Pramod Kolar, Hillsboro, OR (US); Eric A. Karl, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 13/991,423

(22) PCT Filed: Dec. 31, 2011

(86) PCT No.: PCT/US2011/068286
§ 371 (c)(1),
(2), (4) Date: Jun. 3, 2013

(87) PCT Pub. No.: WO2013/101250
PCT Pub. Date: Jul. 4, 2013

(65) Prior Publication Data
US 2014/0169077 A1  Jun. 19, 2014

(51) Int. Cl.
*G11C 11/412*  (2006.01)
*G11C 11/419*  (2006.01)

(52) U.S. Cl.
CPC .......... *G11C 11/412* (2013.01); *G11C 11/419* (2013.01)

(58) Field of Classification Search
CPC ..... G11C 11/41; G11C 11/419; G11C 11/412; G11C 11/413; G11C 11/417
USPC .......... 365/154, 156, 226, 227, 207
See application file for complete search history.

(56) References Cited

U.S. PATENT DOCUMENTS

| 5,336,914 A | 8/1994 | Andoh |
| 6,111,780 A * | 8/2000 | Bertin ............... 365/154 |
| 7,099,224 B2 * | 8/2006 | Chou ............... 365/226 |
| 7,829,942 B2 * | 11/2010 | Kawasumi et al. ....... 257/330 |
| 2006/0102957 A1 * | 5/2006 | Liaw ............... 257/368 |
| 2007/0236986 A1 | 10/2007 | Fifield et al. |
| 2008/0055967 A1 | 3/2008 | Houston et al. |
| 2008/0173955 A1 * | 7/2008 | Kawasumi et al. ....... 257/401 |
| 2008/0205112 A1 | 8/2008 | Lawson et al. |
| 2009/0059657 A1 * | 3/2009 | Cannon ......... G11C 11/4125 365/163 |

(Continued)

FOREIGN PATENT DOCUMENTS

| JP | 05-304274 A | 11/1993 |
| JP | 10-041410 A | 2/1998 |

OTHER PUBLICATIONS

PCT Notification of Transmittal of the International Search Report and the Written Opinion of the International Searching Authority, or the Declaration for PCT Counterpart Application No. PCT/US2011/068286, 10 pgs., (Sep. 21, 2012).

(Continued)

*Primary Examiner* — Richard Elms
*Assistant Examiner* — Jerome Leboeuf
(74) *Attorney, Agent, or Firm* — Schwabe, Williamson & Wyatt P.C.

(57) ABSTRACT

A static random-access memory is described. The SRAM includes a storage cell and a voltage supply to supply the storage cell with a reduced voltage during a write operation. The SRAM cell includes a first pass gate and a second pass gate. A first resistor is coupled between the first pass gate and a first side of the storage cell. A second resistor is coupled between the second pass gate and a second side of the storage cell.

17 Claims, 13 Drawing Sheets

(56) References Cited

U.S. PATENT DOCUMENTS

| | | | | |
|---|---|---|---|---|
| 2009/0086528 A1* | 4/2009 | Hanafi | .......................... | 365/156 |
| 2009/0175069 A1* | 7/2009 | Houston | ............. | H01L 27/0207 |
| | | | | 365/154 |
| 2010/0309736 A1* | 12/2010 | Russell | ................. | G11C 11/413 |
| | | | | 365/189.011 |
| 2014/0177356 A1* | 6/2014 | Su | ......................... | G11C 11/419 |
| | | | | 365/189.16 |

OTHER PUBLICATIONS

First Office Action for Counterpart Taiwan Patent Application No. 101149814 with Search Report and English Translation of Search Report, 9 pgs; (Feb. 4, 2015).

PCT Notification Concerning Transmittal of International Preliminary Report on Patentability (Chapter I of the Patent Cooperation Treaty) for PCT Counterpart Application No. PCT/US2011/068286, 7 pp., (Jul. 10, 2014).

Office Action issued by the Taiwan Intellectual Property Office for corresponding Taiwanese Patent Application No. 101149814, 9 pp., (dated Sep. 7, 2016).

Search Report issued by the Taiwan Intellectual Property Office for corresponding Taiwanese Patent Application No. 101149814, 2 pp. (including English translation), (dated Aug. 18, 2016).

Office Action issued by the Taiwan Intellectual Property Office for corresponding Taiwanese Patent Application No. 101149814, 8 pp., (dated Oct. 30, 2015).

* cited by examiner

OPERATION AWARE AUTO-FEEDBACK SRAM

CROSS-REFERENCE TO RELATED APPLICATION

This patent application is a U.S. National Phase Application under 35 U.S.C. §371 of International Application No. PCT/US2011/068286, filed Dec. 31, 2011, entitled OPERATION AWARE AUTO-FEEDBACK SRAM.

FIELD

Embodiments of the invention relate to improving read stability for a static random-access memory ("SRAM") without disrupting write operations. More particularly, embodiments of the invention relate to an SRAM that includes (1) resistors coupled to pass gates and (2) a voltage supply that provides a storage cell with a reduced voltage during a write operation.

BACKGROUND

A static random-access memory is a volatile semiconductor memory that does not need to be refreshed but that typically loses data when power is removed from the SRAM. FIG. 1 shows an example of a prior art SRAM bit cell that includes a storage cell comprised of metal oxide semiconductor field effect transistors ("MOSFETs") $M_1$, $M_2$, $M_3$, and $M_4$ that are arranged as two cross-coupled inverters. A MOSFET pass gate transistor $M_5$ couples the storage cell to a bit line BL. A MOSFET pass gate transistor $M_6$ couples the storage cell to an inverse bit line BLB ("bit line bar"). Pass gate transistors $M_5$ and $M_6$ are also referred to as access transistors or pass gates. The word line WL is coupled to the gates of pass gate transistors $M_5$ and $M_6$. The supply voltage $V_{CC}$ is coupled to the storage cell and typically remains constant during standby, read, and write operations.

In the standby mode, the pass gate transistors $M_5$ and $M_6$ disconnect the storage cell from the bit lines BL and BLB.

In the read mode, the bit lines BL and BLB are both precharged to a logical 1. A voltage is applied to the word line WL, enabling both pass gate transistors $M_5$ and $M_6$. The values stored at Q and QB are then transferred to the respective bit lines BL and BLB. If Q is a logical 1, then BLB is discharged through transistors $M_3$ and $M_6$. The bit lines BL and BLB then have a voltage difference between them, which is sensed by a sense amplifier connected to bit lines BL and BLB. Thus, a read operation senses a logical 1 stored in the storage cell. If a logical 0 was stored in the storage cell, then bit line BL would be discharged and a logical 0 would be sensed.

For a write operation writing a logical 0 to the storage cell, the bit line BL would be set to a logical 0 and BLB set to a logical 1. The word line WL is then enabled, causing the values stored on BL and BLB to be latched and stored by the storage cell. The transistors $M_1$, $M_2$, $M_3$, and $M_4$ are relatively weak, allowing them to be overridden by the bit lines. For writing a logical 1, bit line BL would be set to logical 1 and bit line BLB would be set to a logical 0.

Prior art SRAM bit cell design involves finding an operating window where both read and write operations can be performed. An SRAM bit cell needs read stability and the cell needs to be writeable. Those can be competing goals. To make the SRAM bit cell both read stable and writeable, the higher of a read stable and writeable voltage has been used.

Prior art pass gates typically have low resistance in order to improve write operations. But the size of the pass gates and the storage cell transistors has to be such that a read operation minimizes the disturbance of charge stored in the cross-coupled inverters of the storage cell. For relatively large prior art SRAM bit cells, the transistors can be chosen in a way that allows reading and writing even with variations in transistor size associated with semiconductor fabrication.

As transistors have become smaller, the operating windows have become so small that meeting the competing goals associated with reading and writing to an SRAM bit cell has typically been increasingly difficult. SRAM bit cells have been made smaller than 0.1 square micrometers ("$\mu m^2$") using 22 nanometer ("nm") technology.

A prior art technique of word line underdrive has been used to reduce the voltage on the word line WL to less than $V_{CC}$. Word line underdrive typically can be beneficial for read operations by reducing the disturbance on the storage cell transistors. A disadvantage of prior art word line underdrive is that the technique typically involves reducing the word line voltage for both read and write operations, typically resulting in degraded write operations. Prior art word line underdrive relies on there being a sufficient write margin so that writability degradation is not significant. In smaller scales, this assumption may not be true.

BRIEF DESCRIPTION OF THE DRAWINGS

Embodiments of the present invention are illustrated by way of example and not limitation in the figures of the accompanying drawings, in which like references indicate similar elements.

DETAILED DESCRIPTION

A static random-access memory according to an embodiment of the invention is described in more detail below. The SRAM includes a voltage supply to supply the storage cell with a reduced voltage during a write operation. The SRAM includes a first pass gate and a second pass gate. A first resistor is coupled between the first pass gate and a first side of the storage cell. A second resistor is coupled between the second pass gate and a second side of the storage cell.

An embodiment of the invention provides a design for an SRAM that facilitates the finding of an operating window where both read and write operations can be performed even for small scale SRAM cells, including SRAM cells that are smaller than 0.1 $\mu m^2$ using 22 nm (or smaller) technology. This is so even though read and write operations typically have conflicting requirements.

An embodiment of the present invention helps to weaken the pass gate only during a read operation and not during a write operation. An embodiment of the present invention exploits the fact that the direction of current flow through the SRAM pass gate is opposite between read and write operations. A resistor between a pass gate and a side of the SRAM storage cell acts like an operation sensor (sensing a read or a write operation) and provides negative feedback only during a read operation. The resistor between the pass gate and a side of the SRAM storage cell also acts as an actuator and weakens the pass gate only during read operation. The resistor between the pass gate and a side of the SRAM storage cell also provides process, voltage, and temperature ("PVT") tracking.

Figure 1:
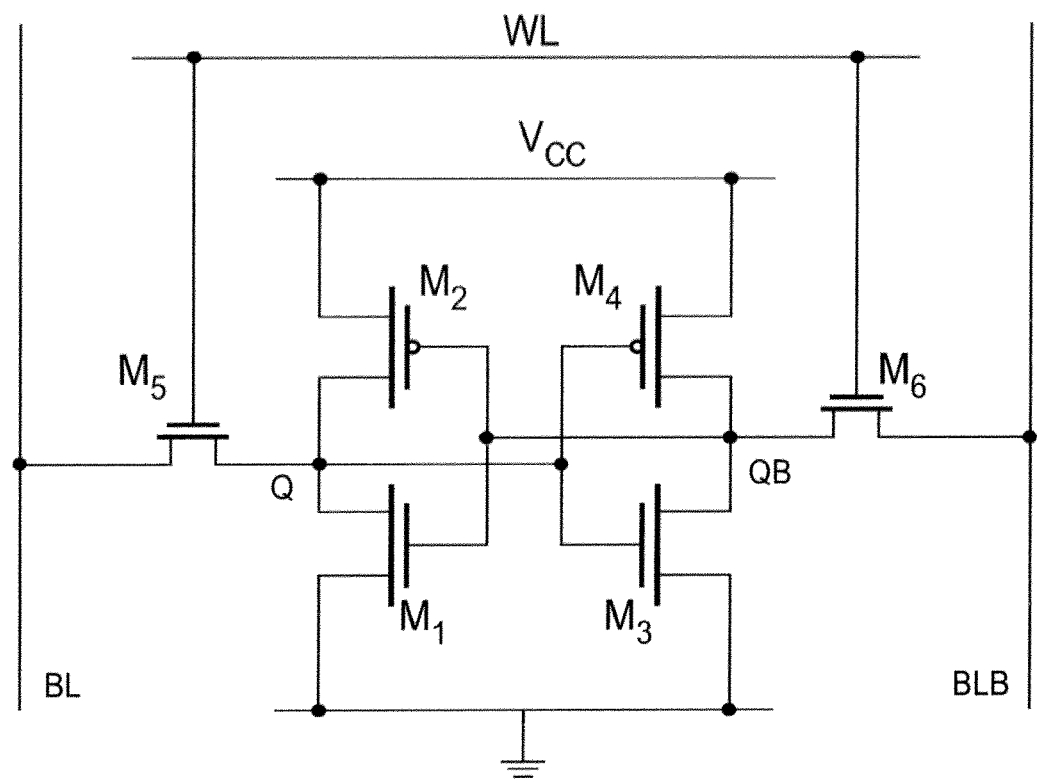
FIG. 1 illustrates a prior art SRAM bit cell.
Figure 2:
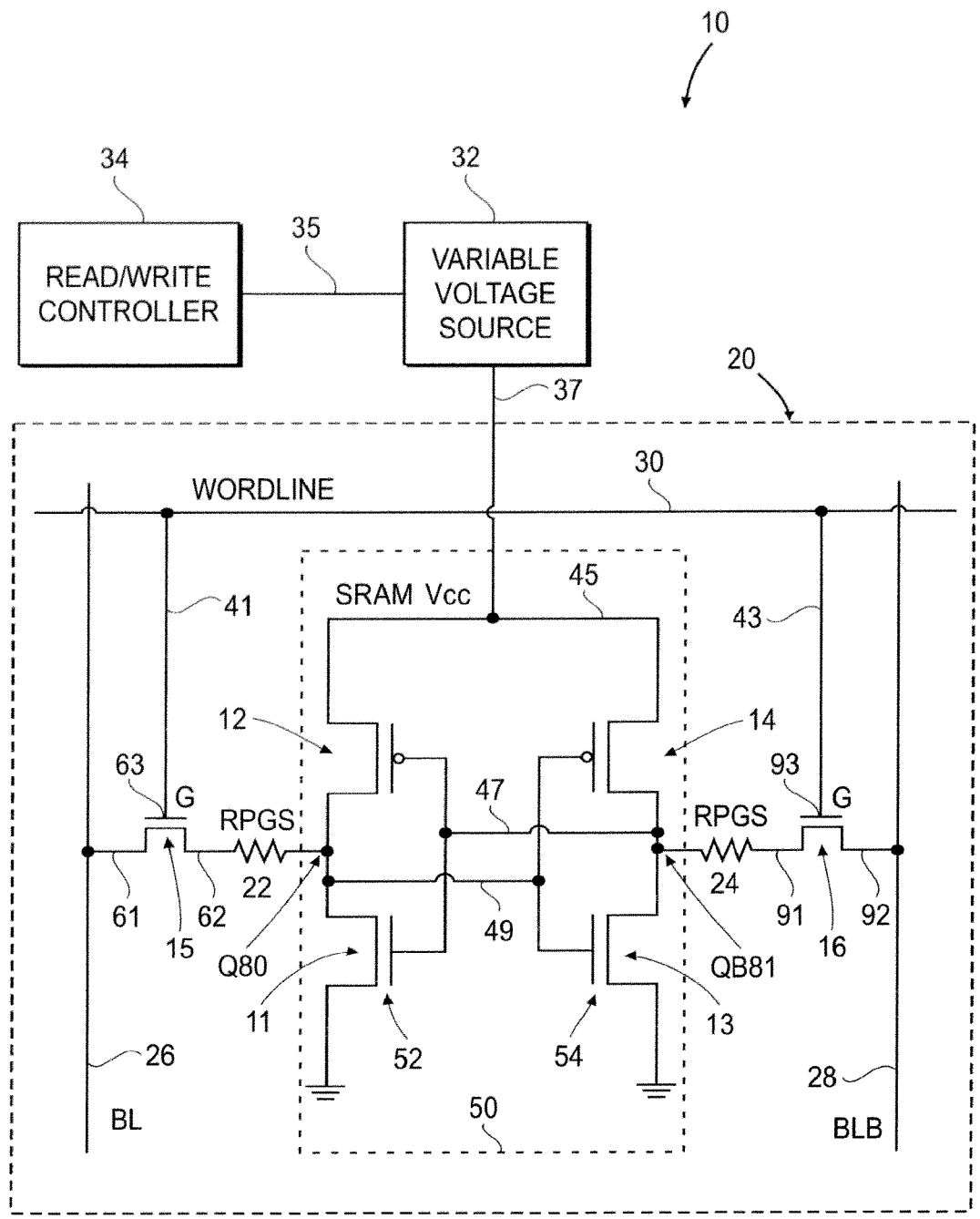
FIG. 2 illustrates an SRAM circuit technology according to an embodiment of the invention.

FIG. 2 illustrates circuitry 10 of an SRAM that includes storage cell 20, variable voltage source 32, and read/write controller 34. SRAM bit cell 20 includes an SRAM storage cell 50. SRAM storage cell 50 includes MOSFET transistors 11, 12, 13, and 14. Storage transistors 11 and 12 comprise an inverter 52. Storage transistors 13 and 14 comprise an inverter 54. Inverters 52 and 54 form cross-coupled inverters that are connected via lines 47 and 49. Thus, storage cell 50 is comprised of cross-coupled inverters 52 and 54. Transistors 12 and 14 are each a p-type MOSFET transistor (i.e., PMOS). Transistors 11 and 13 are each an n-type MOSFET transistor (i.e., NMOS). Read/write controller 34 controls variable voltage source 32 via line 35. Variable voltage source 32 is coupled to line 45 of the storage cell 50 via line 37. For one embodiment of the invention, variable voltage source 32 supplies an SRAM $V_{CC}$ voltage to storage cell 50. The SRAM $V_{CC}$ voltage can be a variable voltage that can range from $V_{CC}$ to a lesser voltage than $V_{CC}$. The SRAM $V_{CC}$ voltage is decoupled from the $V_{DD}$ voltage. For one embodiment, $V_{CC}$ is 5 volts. For another embodiment, the voltage $V_{CC}$ is less than the supply voltage $V_{DD}$. For one embodiment $V_{DD}$ is 5 volts and $V_{CC}$ is 750 millivolts. For one embodiment, the SRAM $V_{CC}$ voltage can be varied from $V_{CC}$ down to the voltage $V_{TP}$. For one embodiment, the voltage $V_{TP}$ is approximately 300 millivolts. For other embodiments, the variable voltage source 32 can vary the SRAM $V_{CC}$ voltage to other values.

Line 45 is connected to the top of inverters 52 and 54. The opposite side of each of inverters 52 and 54 is coupled to ground for one embodiment of the invention.

SRAM bit cell 20 also includes a bit line BL 26 and a bit line bar BLB 28. Bit line 26 and bit line bar 28 are in turn coupled to bit line drivers (not shown) of the SRAM.

SRAM bit cell 20 also includes a word line WL 30 that is coupled to a word line driver (not shown) of the SRAM.

SRAM bit cell 20 also includes pass gate transistors 15 and 16. For one embodiment, each of pass gate transistors 15 and 16 is an NMOS transistor. Pass gate transistors 15 and 16 are also referred to as pass gates 15 and 16.

Pass gate transistor 15 has a node 61 coupled to bit line 26. The gate 63 of pass gate transistor 15 is coupled via line 41 to word line 30.

A pass gate resistor RPGS 22 is coupled between node 62 of transistor 15 and a node Q80 to inverter 52 of storage cell 50. Pass gate resistor RPGS 22 is thus coupled to storage transistors 11 and 12.

For one embodiment of the invention, pass gate resistor RPGS 22 is approximately 2.205 kilohms. For alternative embodiments of the invention, pass gate resistor RPGS 22 can have other resistance values. For example, the resistance can range from a few hundred ohms to greater than 2.5 kilohms.

For a pass gate resistor RPGS 22 implemented in silicon, the pass gate resistor RPGS 22 is not a discrete device but instead comprises MOS circuitry that has a resistive property and acts as a resistor. The resistance value of an integrated circuit is chosen to form pass gate resistor RPGS 22.

Pass gate transistor 16 has a node 92 coupled to bit line bar 28. The gate 93 of pass gate transistor 16 is coupled via line 43 to word line 30. Pass gate resistor RPGS 24 is coupled between node 91 transistor 16 and node QB81 inverter 54. Pass gate resistor RPGS 24 is thus coupled to storage transistors 13 and 14. For one embodiment of the invention, pass gate resistor RPGS 24 is approximately the same size as pass gate resistor RPGS 22. For one embodiment, pass gate resistor RPGS 24 is approximately 2.205 kilohms. For alternative embodiments, pass gate resistor RPGS 24 can have other resistance values. For example, the resistance can range from a few hundred ohms to more than 2.5 kilohms.

For one embodiment, pass gate resistor RPGS 24 is not a discrete resistor. Instead, pass gate resistor RPGS 24 is an integrated circuit formed by semiconductor processing techniques that has a desired resistance level. The inclusion of pass gate resistors RPGS 22 and RPGS 24 in circuitry 10 makes the SRAM bit cell 20 more read stable by weakening the flow of current through a respective pass gate during a read operation, as will be explained in more detail below.

The inclusion of variable voltage source 32 helps to improve write operations for SRAM bit cell 20. Variable voltage source 32 allows for a write-assist scheme that allows the voltage at line 45 to be reduced during a write operation. The write-assist scheme helps to ensure that pass gate resistors RPGS 22 and RPGS 24 do not negatively impact write operations.

Figure 3:
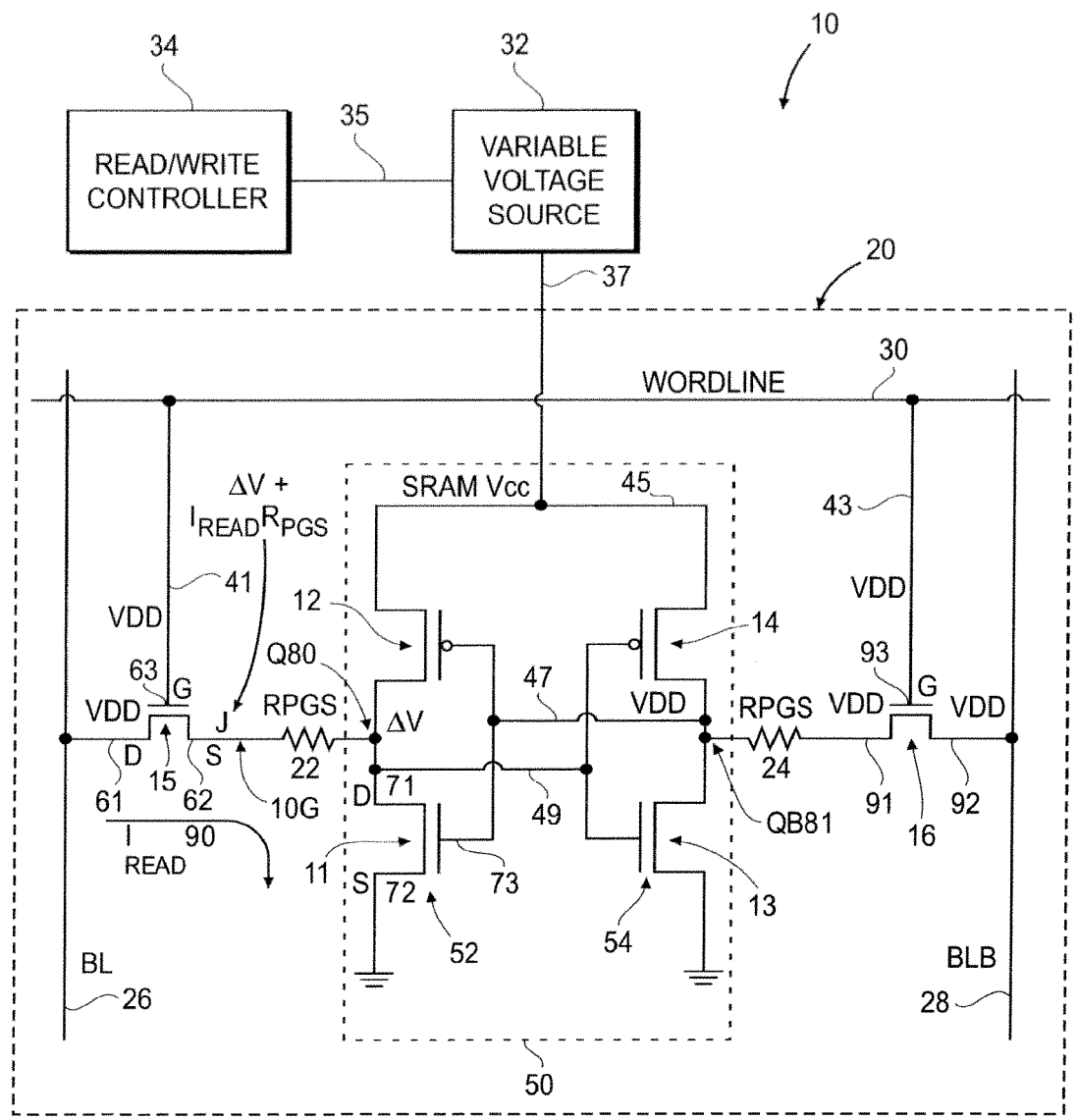
FIG. 3 illustrates an SRAM circuit of an embodiment of the invention during a read operation.

FIG. 3 illustrates the operation of SRAM circuitry 10 for an SRAM read operation. In the read mode, the bit lines BL 26 and BLB 28 are both precharged to a logical 1. For one embodiment of the invention, a logical 1 equals $V_{DD}$. For one embodiment, $V_{DD}$ equals 5 volts. A logical 0 equals ground, also referred to as $V_{SS}$. For an alternative embodiment, a logical 0 is a voltage close to ground. So in the read mode, bit lines BL 26 and BLB 28 are both precharged to $V_{DD}$. Assume for the following discussion that a logical 0 is stored at node Q80 of SRAM storage cell 50. Given that there is a voltage drop across storage transistors between node Q80 and ground, a logical 0 at node Q80 means that a relatively small voltage of $\Delta V$ is stored at node Q80. For one embodiment, $\Delta V$ is a small voltage value that is the voltage between the drain 71 and the source 72 of storage transistor 11, representing the ON current times the natural resistance of storage transistor 11. Accordingly, a logical 1 is stored at node QB81 of storage cell 50, which means that a voltage $V_{DD}$ is stored at node QB81, which is the right side of storage cell 50.

An ideal read operation would be one in which the voltages at nodes Q80 and QB81 would not be disturbed. Thus, after the read operation, a logical 0 would be stored at node Q80 and a logical 1 would be stored at node QB81. To avoid disturbing the voltage at node Q80, given that the bit line 26 is precharged, the path involving pass gate 15 and pass gate resistor 22 would necessarily be a path of high resistance to avoid the loss of charge at node Q80.

As part of the read operation, a voltage $V_{DD}$ is applied to the word line 30. The voltage $V_{DD}$ on word line 30 is then applied via line 41 to the gate of pass gate transistor 15 via line 41 and the voltage $V_{DD}$ is applied to the gate 93 of pass gate transistor 16 via line 43. The logical value stored at node Q80 is then transferred to bit line 26 via pass gate transistor 15 and pass gate resistor RPGS 22. Similarly, the logical value stored at node QB81 is transferred to bit line bar 28 via pass gate transistor 16 and pass gate resistor RPGS 24. Given that the logical value at node QB81 is a logical 1 and the logical value on BLB 28 is likewise a logical 1, there is no current through pass gate transistor 16 or through pass gate resistor RPGS 24. The voltage $V_{DD}$ appears on the gate 93 of pass gate transistor 16 and at nodes 91 and 92 of pass gate transistor 16. Therefore, the pass gate resistor RPGS 24 has no impact on this situation wherein node QB81 is at logical 1 for a read operation.

In contrast, for this read operation wherein a logical 1 resides on bit line 26 and a logical 0 resides at node Q80 and a voltage $V_{DD}$ appearing on word line 30, current 90 then flows from bit line 26 through NMOS pass gate transistor 16, pass gate resistor RPGS 22, and NMOS storage transistor 11 to ground. Thus, bit line 26 discharges partially from voltage $V_{DD}$ towards ground. For one embodiment, bit line 26 only discharges enough to be sensed and does not discharge fully to ground.

One of the goals of an embodiment of the present invention, however, is to avoid the disturbance of the voltage stored at node Q80. Thus, in this situation the goal is to avoid having node Q80 have a voltage increase towards voltage $V_{DD}$. The pass gate resistor RPGS 22 helps to minimize any voltage disturbance with respect to node Q80 of storage cell 50.

During the read operation, read current 90 causes a voltage drop across pass gate resistor RPGS 22 of the current 90 ($I_{READ}$) times the resistance of the pass gate resistor RPGS 22. Given that the voltage at node Q80 is $\Delta V$ volts, the voltage at point 100 is $\Delta V + I_{READ90} \cdot R_{RPGS22}$. For this read operation, node 61 of the NMOS pass gate transistor 15 acts as the drain and node 62 of pass gate transistor 15 acts as the source of pass gate transistor 15. The current flow though pass gate transistor 15 is from drain to source.

During this read operation, the voltage $V_{DD}$ appears at gate 63 of pass gate transistor 15 and the voltage $V_{DD}$ appears at the drain 61 of pass gate transistor 15. The voltage difference between point 100 and point 63 is the difference between $V_{DD}$ and $\Delta V + I_{READ90} \cdot R_{RPGS22}$. This difference is the gate to source voltage for transistor 15. This places pass gate transistor 15 in a saturation mode during a read operation.

The presence of the pass gate resistor RPGS 22 in the circuit 10 means that during the read operation the voltage at point 100 is more than it would be without resistor RPGS 22 being in the circuit. Thus, the presence of pass gate resistor RPGS 22 in the circuit causes a smaller gate drive on pass gate transistor 15 than would otherwise occur. This means this results in less current passing through pass gate transistor 15 during a read operation. The pass gate resistor 22 also reduces the voltage difference between the drain (node 61) and source (node 62) of the pass gate transistor 15, further reducing current flow. This helps to reduce the possibility of disturbing the voltage residing at node Q80 during a read operation. Nevertheless, for an embodiment of the invention, there is just enough current $I_{READ90}$ passing through pass gate transistor 15 and resistor RPGS 22 to allow the voltage on bit line 26 to be reduced far enough that a sense operation can take place.

Once the voltage on bit line 26 has been reduced through the read operation, a sensing operation takes place in the SRAM. A sense amplifier (not shown) is connected to bit lines BL 26 and BLB 28. Given that a logical 1 was stored at node QB81 and a logical 1 was stored at bit line bar 28, there is now a voltage difference between bit line 26 and bit line bar 28 after the read operation. A sense amplifier (not shown) senses the voltage difference between bit line 26 and bit line bar 28 and indicates that a logical 0 is stored in storage cell 50 of the SRAM.

For one embodiment, the read operation should be done relatively quickly to avoid the least amount of disturbance of the voltage at node Q80. For one embodiment of the invention, a relatively small transistor 15 should be used to allow faster switching, smaller current, and less capacitance.

The use of the pass gate resistor RPGS 22 exploits the operation-dependent direction of the current flow through SRAM bit cell 20 to create a self-biasing pass gate transistor 15. This scheme is also referred to as a read-biasing technique.

FIG. 3 shows a read operation wherein a logical 0 is stored in storage cell 50. If a logical 1 is stored in storage cell 50, the read operation is similar but what happens on either side of storage cell 50 is reversed. In particular, if a logical 1 is stored in the storage cell 50 then a logical 1 would appear at node Q80 and a logical 0 would appear at node QB81. The bit lines BL 26 and BLB 28 would both be precharged to a logical 1. Nevertheless, bit line bar 28 would then be partially discharged through pass gate transistor 16 and pass gate resistor RPGS 24. There then would be a voltage differential between bit line 26 and bit line bar 28, which would be sensed by a sense amplifier (not shown) connected to the bit line 26 and bit line bar 28. The sense amplifier would then sense that a logical 1 was stored in the storage cell. For a read operation involving a logical 1 stored in the storage cell 50, the pass gate resistor RPGS 24 would act as the self-biasing pass gate transistor.

Thus, each of resistors RPGS 22 and RPGS 24 effectively provide a read-assist with respect to SRAM bit cell 20.

An advantage of pass gate resistors RPGS 22 and RPGS 24 is that it gives the SRAM system designer another variable to work with respect to the sizing of the transistors within SRAM bit cell 20. Although sizing still needs to be done with respect to the transistors of SRAM bit cell 20, the inclusion of pass gate resistors 22 and 24 allows easier sizing of the transistors for proper read and write operation for small geometries of integrated circuits. For one embodiment of the invention, each of the pass gate resistors RPGS 22 and RPGS 24 has a resistance of approximately 2.205 kilohms. Nevertheless, different sizing of the pass gate transistors 15 and 16 can result in different size resistors RPGS 22 and RPGS 24. If the pass gate transistors 15 and 16 are made larger, then for one embodiment the resistance value of each of resistors RPGS 22 and RPGS 24 is greater than 2.205 kilohms. If the pass transistors 15 and 16 are made larger, this typically means the overall system would have less variation and would have tighter margins.

Each of pass gate resistors RPGS 22 and RPGS 24 also provides process, voltage, and temperature ("PVT") tracking. As process and voltage change, the strength of each of resistors RPGS 22 and RPGS 24 changes. The resistor strength is weaker at the process corner RSSS. The resistor strength is faster at process corner RFFF. Process corners represent the extremes of parameter variations within which a circuit that has been etched onto a wafer must function correctly. Each of pass gate resistors RPGS 22 and RPGS 24 is mostly independent of process/voltage corners and provides less negative feedback at process corner RSSS (lower voltage) and more at process corner RFFF (higher voltage). Each of the pass gate resistors RPGS 22 and RPGS 24 also compensates for temperature shifts by applying more negative feedback at higher temperatures given that the resistance of each of the pass gate resistors RPGS 22 and RPGS 24 is higher at higher temperatures.

Figure 4:
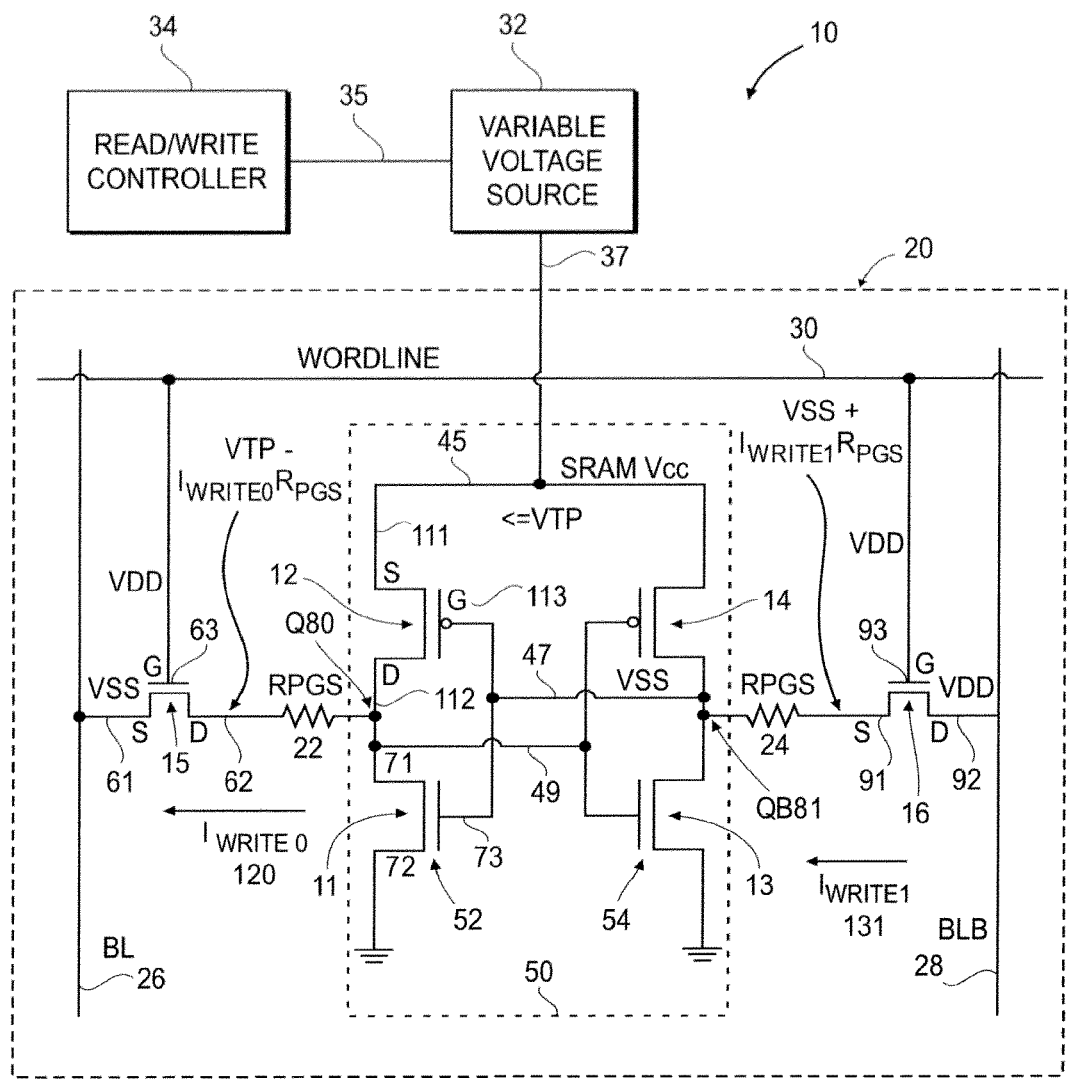
FIG. 4 illustrates an SRAM circuit of an embodiment of the invention during a write operation.
Figure 5:
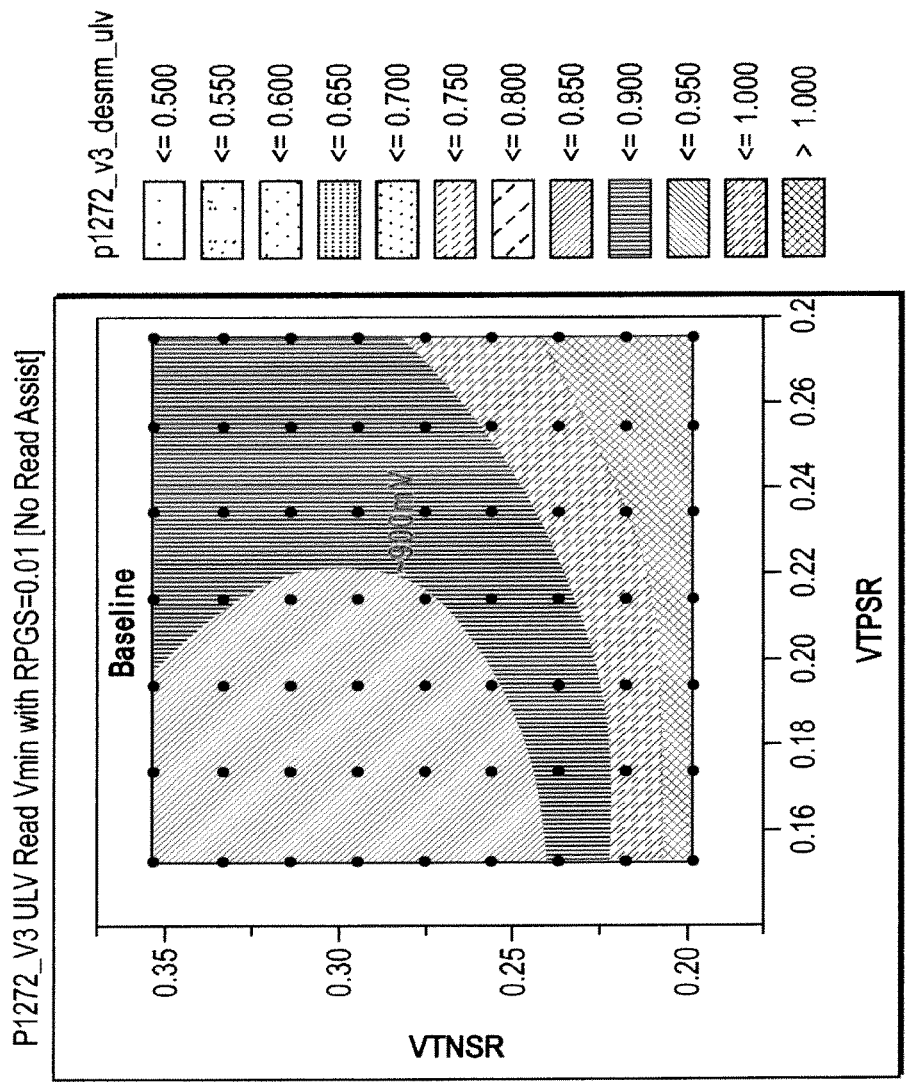
FIGS. 5-11 show simulated operating contours for an embodiment of an SRAM.
Figure 6:
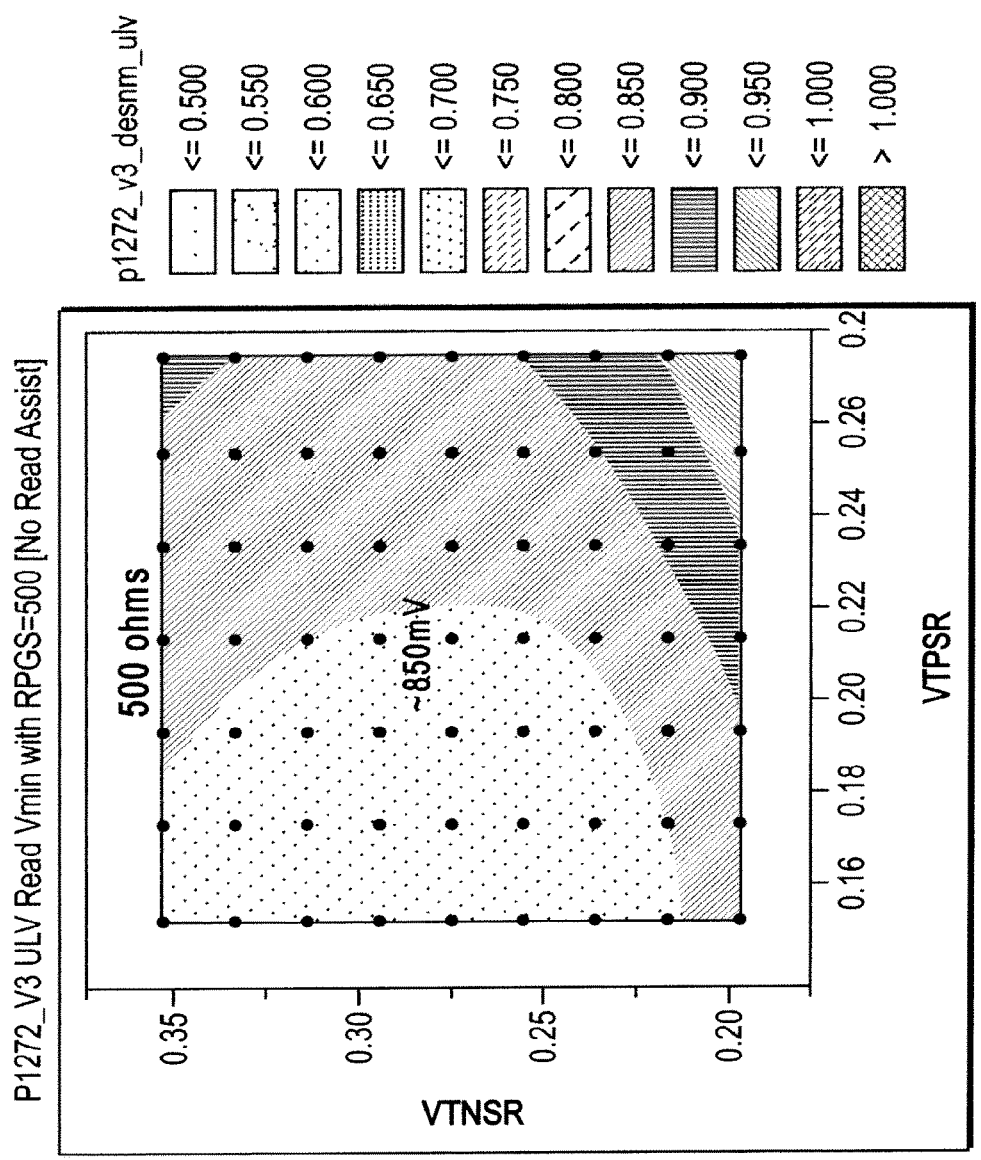
Figure 7:
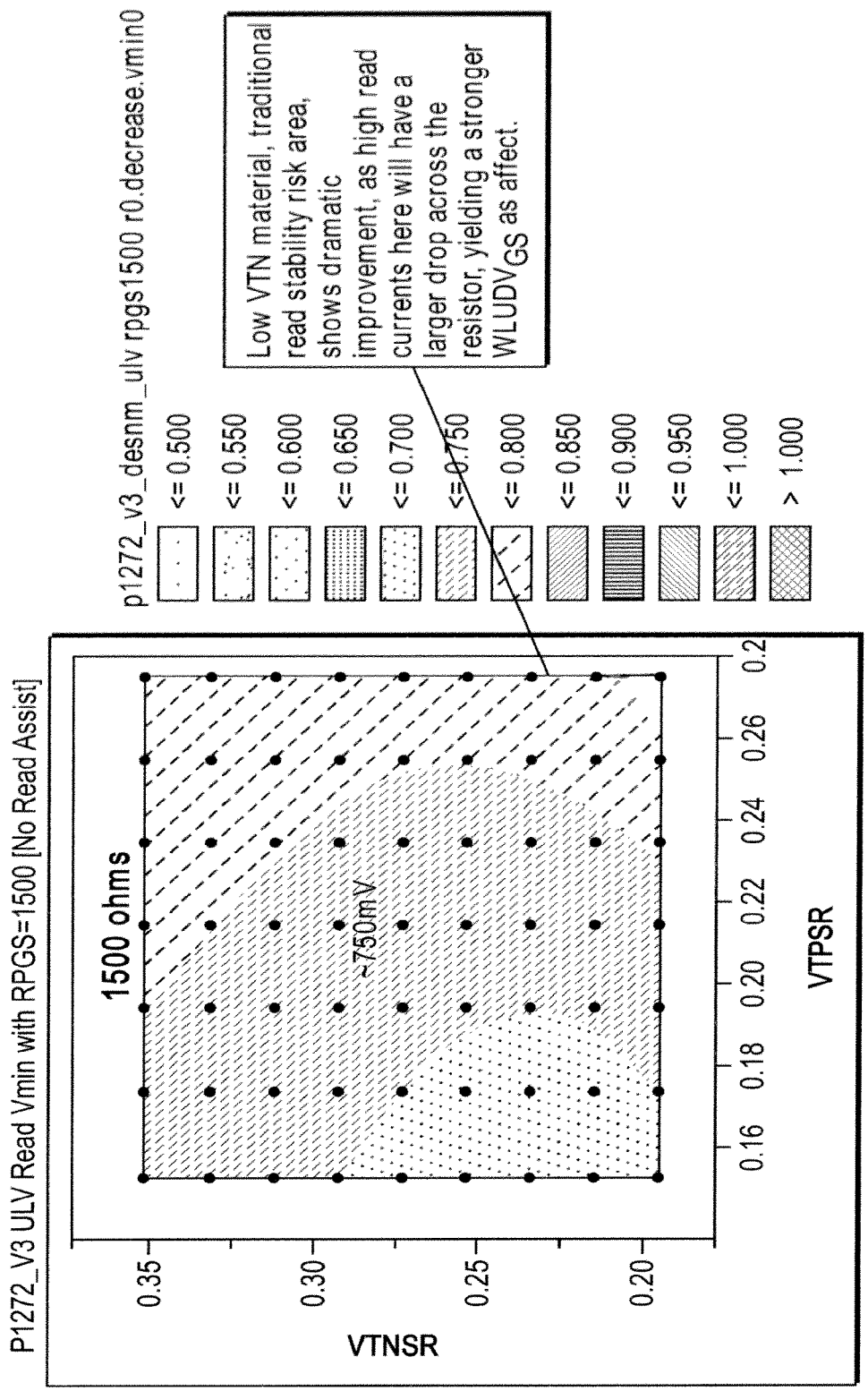
Figure 8:
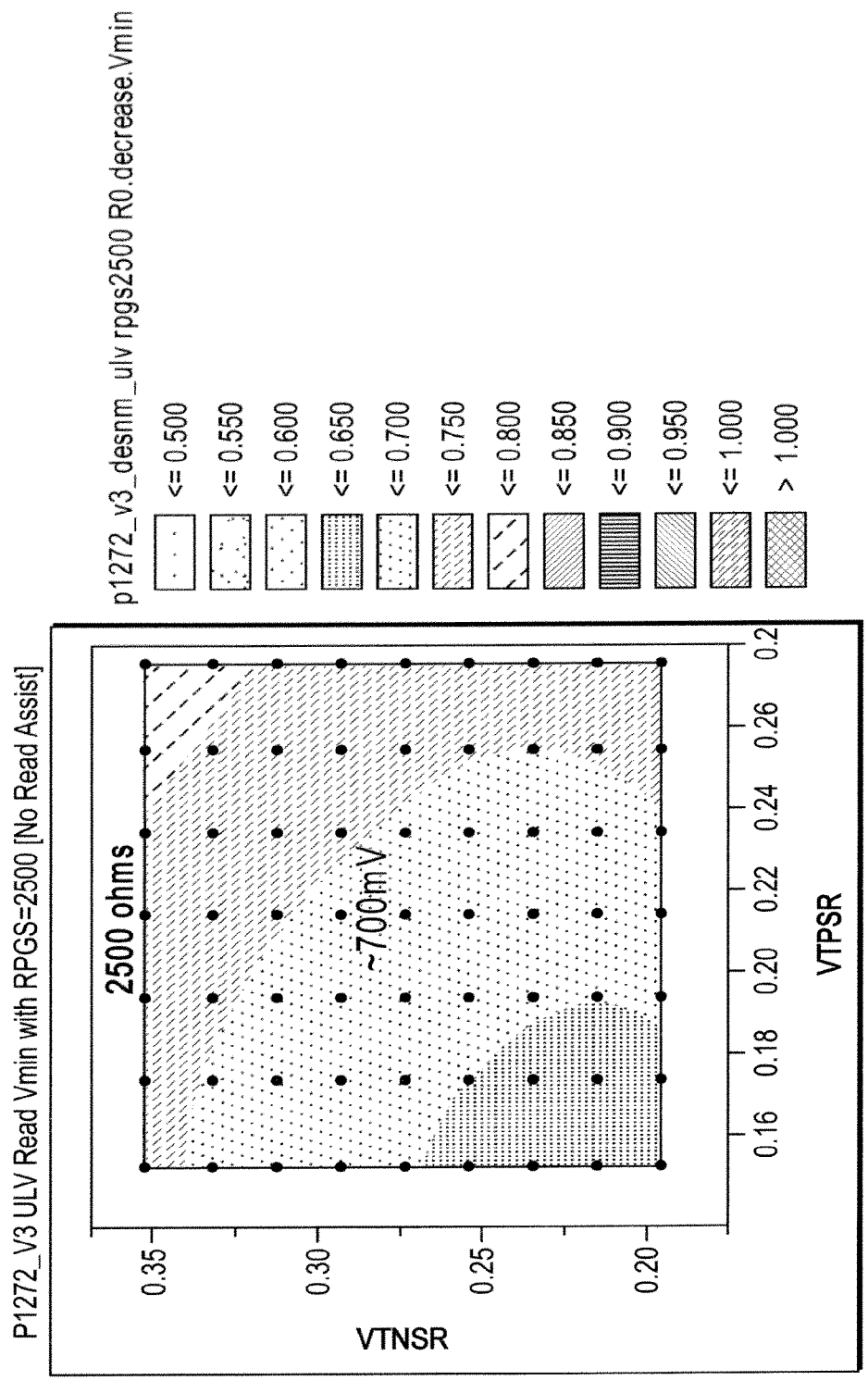
Figure 9:
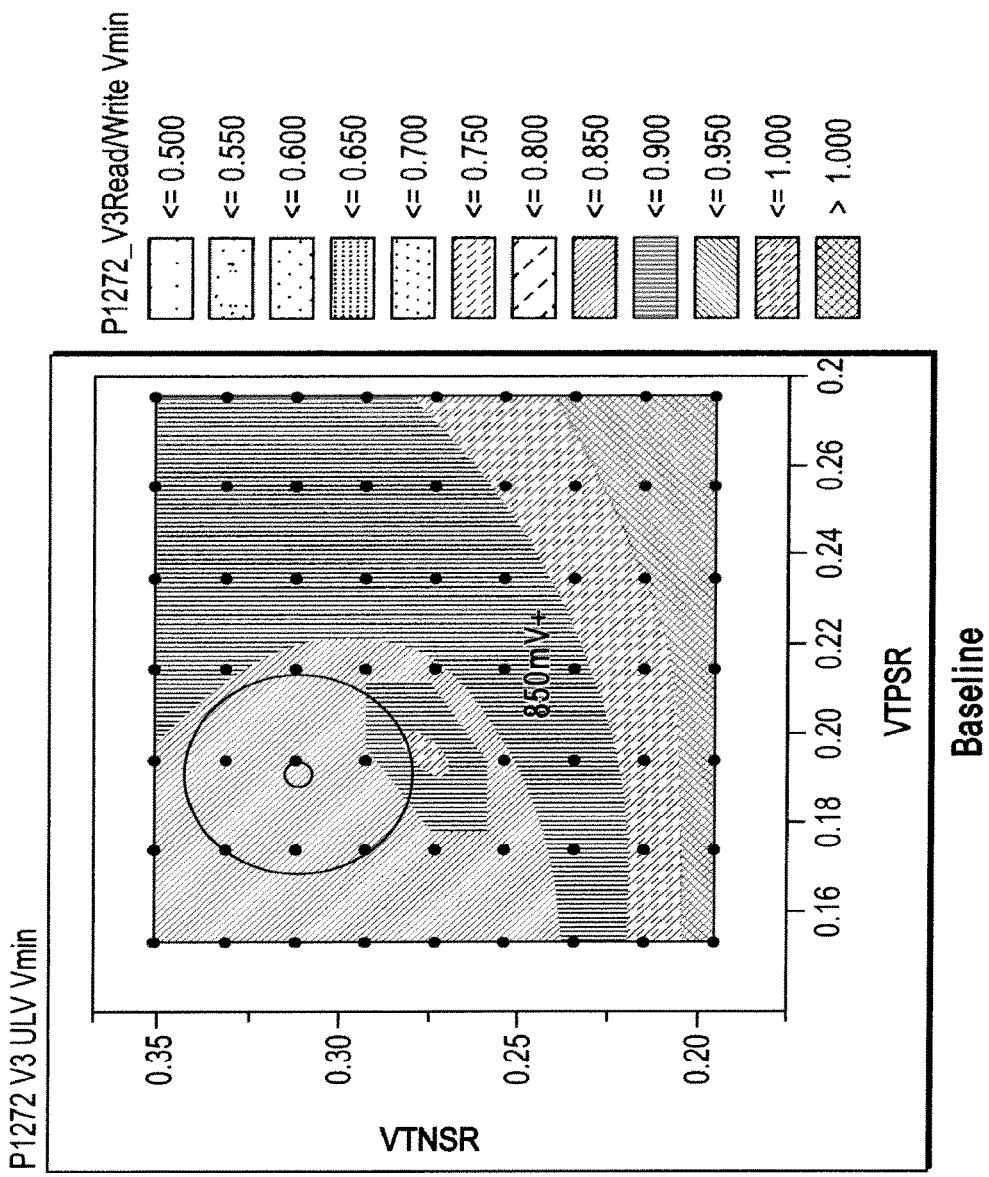
Figure 10:
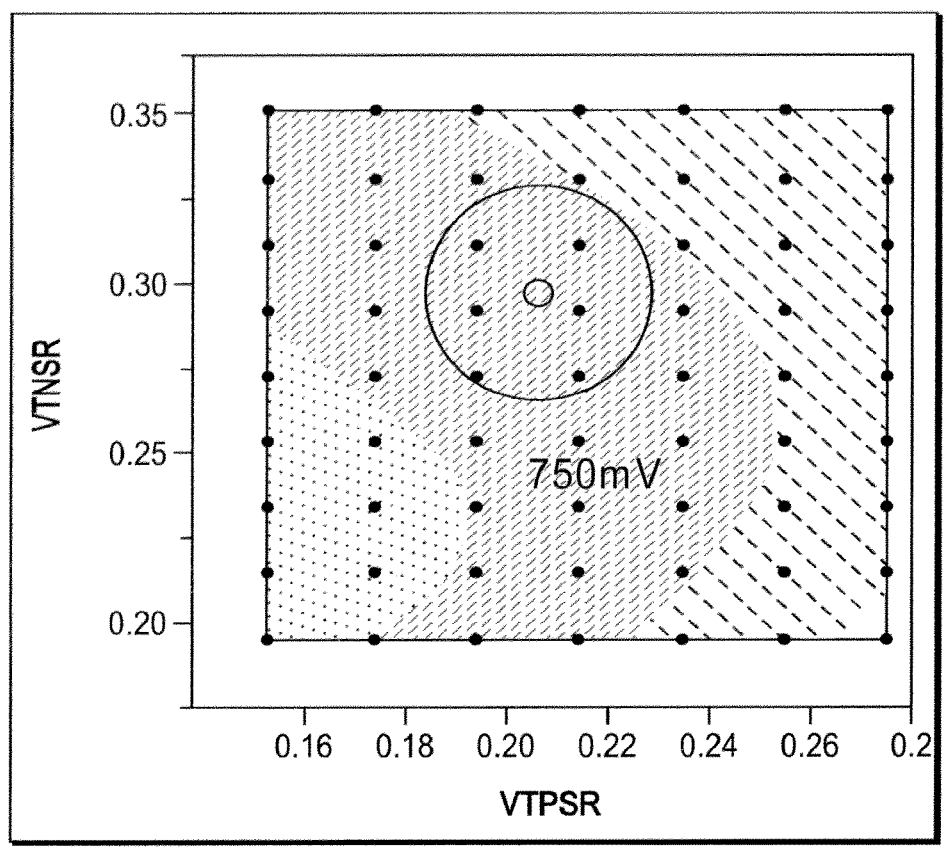
Figure 11:
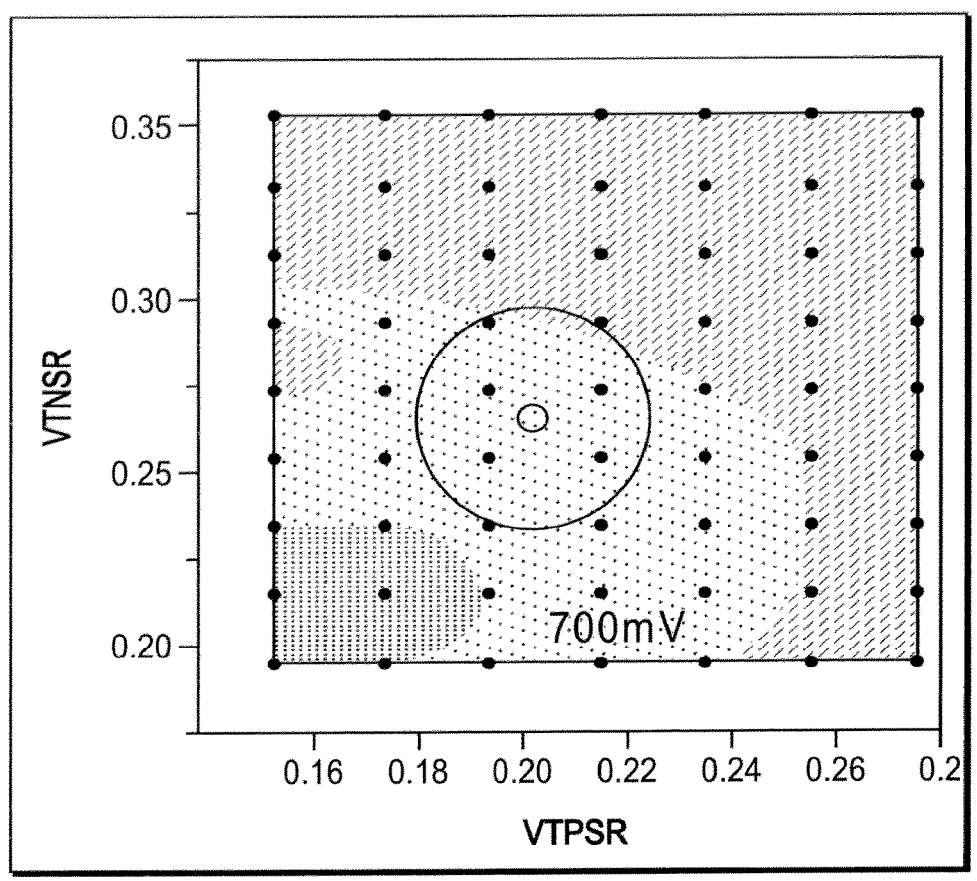

FIG. 4 illustrates an SRAM write operation with respect to SRAM circuitry 10 and SRAM bit cell 20. For the write operation shown in FIG. 4, assume that a logical 1 is currently stored in the SRAM storage cell 50. Further assume that a logical 0 is to be written to the storage cell 50. Therefore, prior to the write operation, a logical 0 is stored at node QB81 and a logical 1 is stored at node Q80 of storage cell 50. The logical 0 stored at node QB81 is voltage $V_{SS}$, which is 0 volts or ground. The logical 1 stored at node Q80 equals voltage $V_{DD}$.

As stated above, a logical 0 is to be written to the storage cell 50, that currently stores a logical 1. Therefore, as part of the write operation, a logical 0 is placed on bit line 26 and a logical 1 is placed on bit line bar 28. The logical 0 on bit line 26 corresponds to voltage $V_{SS}$, which is 0 volts. The logical 1 voltage on bit line bar 28 corresponds to voltage $V_{DD}$, which is a positive non-zero voltage.

To proceed with the write operation, the word line 30 is then enabled by placing a positive voltage $V_{DD}$ on word line 30. The voltage $V_{DD}$ on word line 30 is then transferred via line 63 to the gate of pass gate transistor 15 and via line 93 to the gate of pass gate transistor 16.

For the write operation, circuitry 10 employs a write-assist scheme to avoid the negative effects of having each of pass gate resistors RPGS 22 and RPGS 24 in the circuitry 10. The write-assist scheme is also referred to as SRAM $V_{CC}$ collapse. Prior to the write operation, the positive voltage $V_{CC}$ is applied at node 45 by variable voltage source 32 via line 37. As the write operation begins, however, read/write controller 34 sends a signal on line 35 to variable voltage source 32. Variable voltage source 32 in turn sends out a lower voltage to node 45 via line 37. In other words, variable voltage source 32 reduces the voltage on node 45. For one embodiment, during the write operation the voltage on node 45 is reduced from $V_{CC}$ to voltage $V_{TP}$, which is the approximately the same voltage at node Q80. For one embodiment, the voltage at node 45 is not reduced to less than the voltage $V_{TP}$ because otherwise there would be a negative cutoff with respect to PMOS storage transistor 12.

Initially, before the write operation, voltage $V_{DD}$ is stored at node Q80. For one embodiment of the present invention, voltage $V_{DD}$ equals approximately 5 volts and voltage SRAM $V_{CC}$ initially equals approximately 5 volts. For another embodiment, SRAM $V_{CC}$ initially equals 750 millivolts. Once the SRAM $V_{CC}$ collapse is initiated, as part of the write operation, then the voltage at node 45 is reduced to the voltage $V_{TP}$, which is approximately 300 millivolts for one embodiment of the present invention. Reducing node 45 from 5 volts to 300 millivolts is part of the write-assist SRAM $V_{cc}$ collapse causes a voltage differential across the drain 112 and the source 111 of storage transistor 12 of the difference between $V_{DD}$ and $V_{TP}$. This causes a current to pass from node Q80 through the channel of PMOS storage transistor 12 from drain 112 to source 111, discharging node Q80 from the voltage $V_{DD}$ down to the voltage $V_{TP}$. Therefore, the SRAM $V_{CC}$ collapse of the write-assist discharges node Q80 through storage transistor 12.

The reduction of node Q80 from the voltage $V_{DD}$ to voltage $V_{TP}$ by the write-assist operation means that only a smaller voltage of $V_{TP}$ then needs to be discharged from node Q80 via pass gate transistor 15 and pass gate resistor RPGS 22.

There is a voltage drop across pass gate resistor RPGS 22 of current 120 ($I_{WRITE0}$) times the resistance of pass gate resistor RPGS 22. Given that the voltage on the right side of pass gate resistor RPGS 22 at node Q80 is $V_{TP}$, therefore the voltage at node 62 of pass gate transistor 15 is the voltage $V_{TP}$ minus the $I_{WRITE0}$ current (current 120) times the resistance of $R_{RPGS22}$. Node 62 of transistor 15 is the drain of the pass gate transistor 15 given the current flow from drain to source. The source of transistor 15 is node 61 and the gate of transistor 15 is node 63. During the write operation, the source at node 61 of transistor 15 is at $V_{SS}$ (0 volts) and the gate of transistor 15 is at voltage $V_{DD}$. Given that for one embodiment of the invention, the voltage $V_{TP}$ is a relatively low voltage of approximately 300 millivolts and given that the voltage $V_{DD}$ appears on the gate 63 of transistor 15 and the voltage $V_{SS}$ appears on the source 61 of pass gate transistor 15, the pass gate transistor 15 operates in the linear region during the write operation.

Having the pass gate transistor 15 in the linear mode during the write operation means that the linear mode write current through pass gate transistor 15 is relatively low, increasing the amount of time it takes to discharge node Q80 of storage cell 50. Nevertheless, reducing the write current through pass gate transistor 15 means that the voltage drop across the pass gate resistor RPGS 22 is reduced. That means the negative effect of having the pass gate resistor RPGS 22 in the circuit is reduced. The result is an asymmetric effect of the pass gate resistor RPGS 22 assisting in improving the read operation but nevertheless having a reduced negative impact with respect to the write operation. The SRAM $V_{CC}$ collapse write-assist during a write operation causes the node Q80 to be primarily discharged through storage transistor 12. The result is that the voltage between drain and source of the pass gate transistor 15 is reduced, reducing the current flowing between node Q80 and bit line 26, accordingly reducing the voltage drop across pass gate resistor RPGS 22. Therefore, the writing of a logical 0 to node Q80 is not unduly interfered with by the pass gate resistor RPGS 22.

As the write operation continues, node Q80 is discharged to a logical 0 as current flows through pass gate transistor 15 and pass gate resistor RPGS 22 to bit line 26. For one embodiment of the invention, the discharge time of node Q80 during a write operation is approximately 60 picoseconds.

During the write operation, the circuitry at the right side of SRAM bit cell 20 operates similarly to the circuitry during the read operation. In particular, voltage $V_{DD}$ appears at bit line bar 28. Thus, the voltage $V_{DD}$ appears at node 92 of pass gate transistor 16, which acts as the drain of the pass gate transistor 16. The voltage $V_{DD}$ is applied to the gate of pass gate transistor 16, which is node 93. The voltage $V_{SS}$ appears at node QB81 at the beginning of the write operation. Therefore, the voltage drop across the pass gate resistor RPGS 24 is the current $I_{WRITE1}$ (current 121) times the resistance of the pass gate resistor RPGS 24. Thus, the voltage at node 91 of pass gate transistor 16 (which is the source of pass gate transistor 16) is the voltage $V_{SS}$+ $I_{WRITE1} \cdot R_{RPGS24}$. Therefore, the pass gate transistor 16 operates in the saturation region. Nevertheless, the right side of SRAM bit cell 20 is relatively unimportant and provides a negligible contribution to the write operation. This is because the storage transistors 11, 12, 13, and 14 are chosen to have a size so that during a write operation from a logical 1 to a logical 0 the right side of storage cell 50 never flips. Instead, the circuit operation on the right side of SRAM bit cell 20 acts like a dummy read during such a write operation. Thus, the current $I_{WRITE1}$ 121 does not cause inverter 54 to flip.

After the write operation ends, the word line 30 voltage is reduced to 0 volts and the write operation ends. After the end of the write operation, the voltage applied to node 45 by the variable voltage source 32 is returned to the voltage $V_{CC}$. For one embodiment of the invention, the voltage $V_{CC}$ is approximately 5 volts. For another embodiment, $V_{CC}$ is 750 millivolts.

For an alternative write operation, the parameters would accordingly be reversed. Therefore, if the storage cell 50 initially stores a logical 0 before a write operation and a logical 1 is to be written into storage cell 50 by the write operation, then node Q80 would initially be at a logical 0 and node QB81 would be at a logical 1. To write a logical 1 to the storage cell 50, a logical 1 would be applied to bit line 26 and a logical 0 would be applied to bit line bar 28. Although node QB81 would initially be at the voltage $V_{DD}$, an SRAM $V_{CC}$ collapse as part of a write-assist operation would be bring the voltage at node 45 down to approximately the voltage $V_{TP}$, which for one embodiment of the invention would be approximately 300 millivolts. Node QB81 would then be discharged primarily through PMOS storage transistor 14 and node QB81 would eventually reach the voltage of $V_{TP}$. The voltage $V_{TP}$ would then be discharged through pass gate resistor RPGS 24 and pass gate transistor 16. Current would then flow from node QB81 to bit line bar 28. Pass gate transistor 16 would operate in the linear mode, resulting in a reduced amount of currently flowing through pass gate transistor 16. This in turn would reduce the negative effects of having pass gate resistor RPGS 24 in the circuit. At the end of such a write operation, node QB81 would be set to a logical 0 by the flipping of storage cell 50. At the end of the write operation, the word line 30 would have a voltage reduced to 0. At the end of the write operation, the variable voltage source 32 would cause the node 45 voltage to return to the SRAM $V_{CC}$ voltage of $V_{CC}$, which for one embodiment would be 5 volts. For one embodiment of the present invention, the storage cell 50 would then store a logical 1.

One of the advantages of an embodiment of the invention is that the pass gate resistor will be on the drain side of the pass gate transistor during a write, changing the voltage from drain to source, which is a much smaller impact than a voltage from gate to source drop.

Another advantage of an embodiment of the present invention is that it allows SRAM circuitry 10 to operate at a lower value of SRAM $V_{CC}$ voltage. To make the SRAM bit cell 20 both read stable and writeable, the higher of a read stable voltage and a writeable voltage must be used. With the write-assist technique of an embodiment of the invention, the writeable voltage can be reduced, leaving read stability as the $V_{CC}$ minimum limiter.

FIGS. 5-11 illustrate simulated $V_{CC}$ minimum contours for an SRAM cell for various resistance values of each pass gate resistor and for a baseline without pass gate resistors. The x-axis of each graph represents a special voltage for PMOS. The y-axis represents a special voltage for NMOS. The FIGS. 5-11 collectively show that more regions operate well with a lower voltage with the addition of pass gate resistors and a write-assist scheme.

The circuitry of an embodiment of the present invention should allow SRAM circuitry 10 to operate under a $V_{CC}$ of less than 900 millivolts. A lower $V_{CC}$ operating voltage is helpful with respect to certain applications of SRAM, such as for smart phones, which have a limited battery life.

Embodiments of the present invention are useful wherever an SRAM is employed. SRAMs can be embedded in various products, including digital cameras, cell phones, smart phones, synthesizers, automotive electronics, appliances, toys, and industrial and scientific subsystems. For example, SRAMs are also employed in computers, work stations, routers, and peripheral equipment. SRAMs are also employed in caches, hard disk drive buffers, router buffers, LCD screens, and printers. SRAMs are also used in cable modems.

Figure 12:
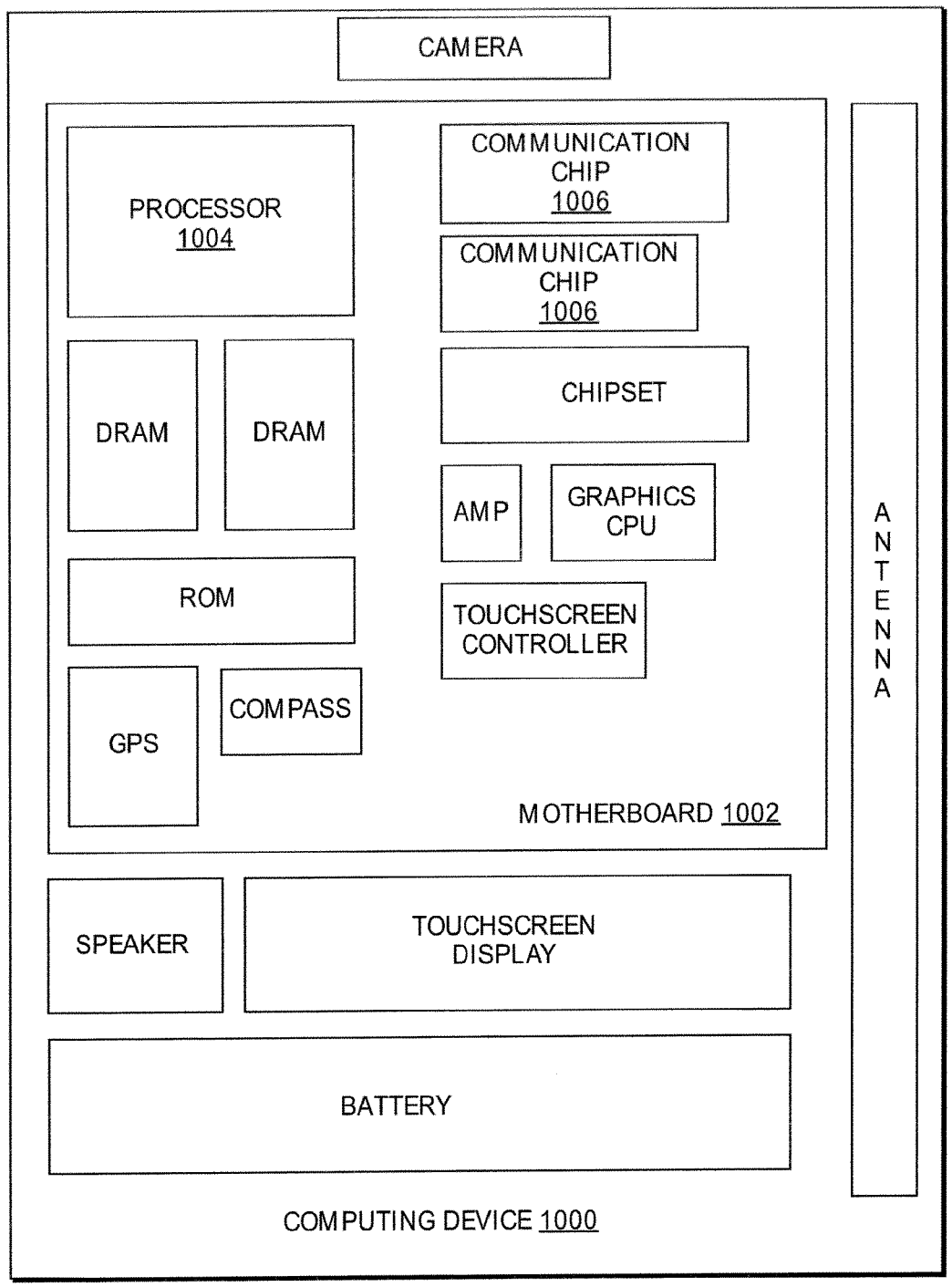
FIG. 12 illustrates a computing device that includes an SRAM of an embodiment of the invention.

FIG. 12 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as transistors or metal interconnects, that are formed in accordance with implementations of the invention of an SRAM in accordance with embodiments. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices, such as transistors or metal interconnects, that are formed in accordance with implementations of the invention of an SRAM in accordance with embodiments.

In further implementations, another component housed within the computing device 1000 may contain an integrated circuit die that includes one or more devices, such as transistors or metal interconnects, that are formed in accordance with implementations of the invention of an SRAM in accordance with embodiments.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 13:
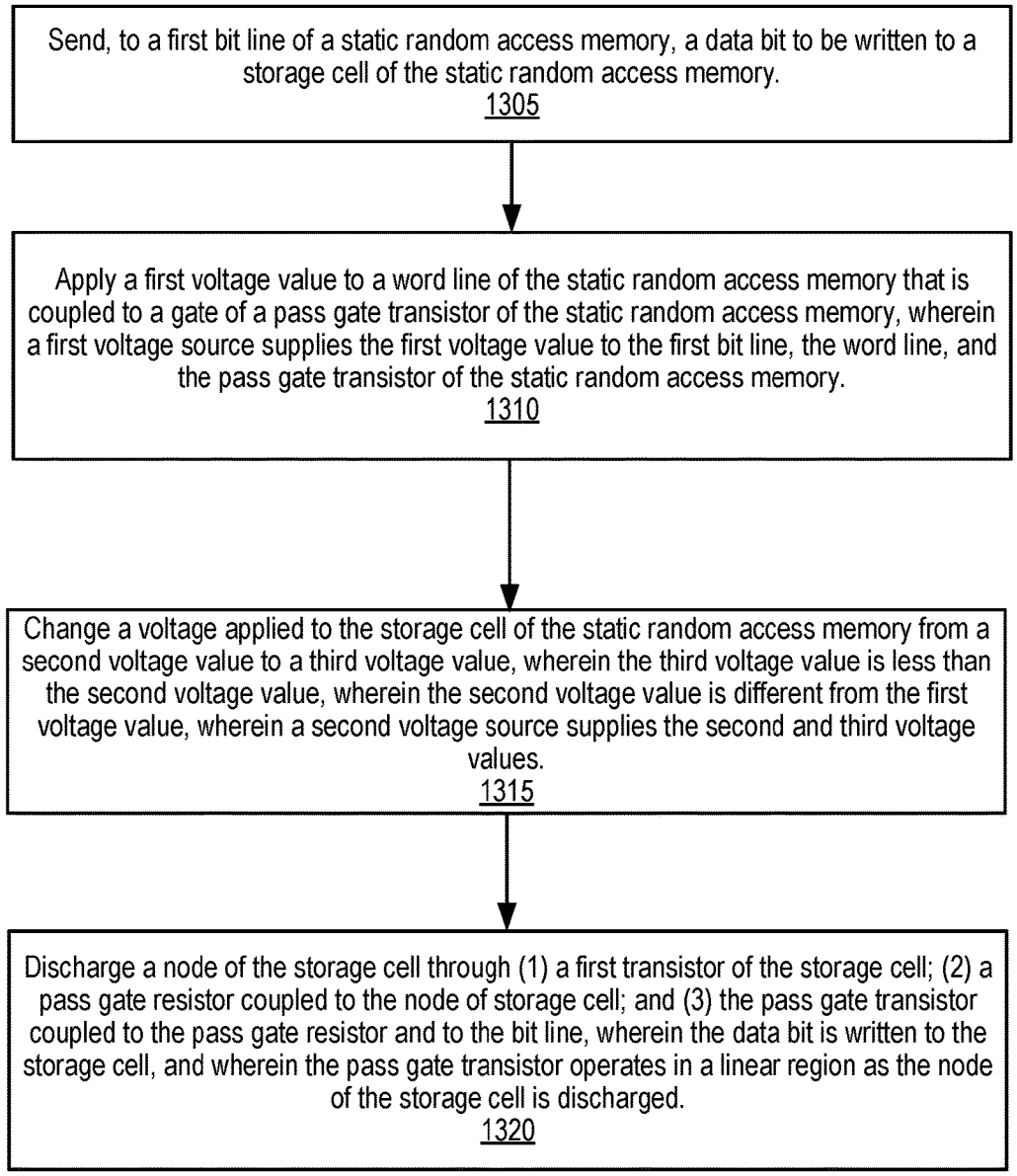
FIG. 13 illustrates a process flow for an SRAM circuit of an embodiment of the invention.

According to one embodiment, FIG. 13 illustrates a process flow 1300 for an SRAM circuit of an embodiment of the invention. For example, process flow 1300 may be implemented in connection with the SRAM circuits of FIGS. 2-4.

According to one embodiment, at block 1305, the process flow sends, to a first bit line of a static random access memory, a data bit to be written to a storage cell of the static random access memory. At block 1310, the process flow applies a first voltage value to a word line of the static random access memory that is coupled to a gate of a pass gate transistor of the static random access memory, wherein a first voltage source supplies the first voltage value to the first bit line, the word line, and the pass gate transistor of the static random access memory. At block 1315, the process flow changes a voltage applied to the storage cell of the static random access memory from a second voltage value to a third voltage value, wherein the third voltage value is less than the second voltage value, wherein the second voltage value is different from the first voltage value, wherein a second voltage source supplies the second and third voltage values. As such, at block 1320, the process flow then discharges a node of the storage cell through (1) a first transistor of the storage cell; (2) a pass gate resistor coupled to the node of storage cell; and (3) the pass gate transistor coupled to the pass gate resistor and to the bit line, wherein the data bit is written to the storage cell, and wherein the pass gate transistor operates in a linear region as the node of the storage cell is discharged.

In the foregoing specification, reference has been made to specific embodiments of the invention. It will, however, be evident that various modifications and changes may be made thereto without departing from the broader spirit and scope of the invention. The specification and drawings are, accordingly, to be regarded in an illustrative rather than a restrictive sense.

What is claimed is:

1. A static random access memory comprising:
    a storage cell;
    a first voltage source to apply to the storage cell a first voltage, which is changed to a second voltage during a write operation, wherein the second voltage is less than the first voltage;
    a first pass gate comprising a first side of the first pass gate and a second side of the first pass gate;
    a second voltage source to apply a third voltage via a word line to the first pass gate and a second pass gate, wherein the first voltage is different from the third voltage during the write operation, wherein the first pass gate to receive the third voltage on the first side of the first pass gate and to operate in a linear region during the write operation as a node of the storage cell is discharged, and the first pass gate to operate in a saturation mode during a read operation, wherein the second voltage is less than the third voltage during the write operation;
    a first resistor coupled between the first pass gate and a first side of the storage cell;
    a second pass gate; and
    a second resistor coupled between the second pass gate and a second side of the storage cell.

2. The static random access memory of claim 1, wherein the storage cell comprises four transistors configured as two cross-coupled inverters.

3. The static random access memory of claim 1, further comprising:
    the word line coupled to a gate of the first pass gate;
    a first bit line coupled to the first side of the first pass gate, wherein the first resistor is coupled to the second side of the first pass gate;
    a second bit line coupled to a first side of the second pass gate, wherein the second resistor is coupled to a second side of the second pass gate.

4. The static random access memory of claim 1, wherein the storage cell comprises:
    a first p-type metal oxide semiconductor (PMOS) transistor coupled to the first voltage source;
    a first n-type metal oxide semiconductor (NMOS) transistor coupled in series with the first PMOS transistor;
    a second PMOS transistor coupled to the first voltage source;
    a second NMOS transistor coupled in series with the second PMOS transistor.

5. The static random access memory of claim 1, wherein at least one of the first and second resistors provides process, voltage, and temperature tracking.

6. The static random access memory of claim 1, wherein the first voltage is less than the third voltage.

7. A static random access memory, comprising:
    storage transistors coupled to receive a first voltage during a read operation and a second voltage during a write operation, wherein the second voltage is less than the first voltage and wherein a first voltage source supplies the storage transistors with the second voltage during the write operation;
    a first pass gate transistor comprising a first side of the first pass gate transistor and a second side of the first pass gate transistor;
    a second voltage source to supply a fixed third voltage via a word line to the first pass gate transistor and a second pass gate transistor, wherein the first voltage is different from the fixed third voltage during the write operation, wherein the first pass gate transistor to receive the fixed third voltage on the first side of the first pass gate transistor and to operate in a linear region during the write operation as a node of the storage cell is discharged, and the first pass gate to operate in a saturation mode during the read operation wherein the second voltage is less than the third voltage during the write operation;
    a first resistor coupled between the first pass gate transistor and a first subset of the storage transistors, the first resistor implemented in silicon;
    a second pass gate transistor;
    a second resistor coupled between the second pass gate transistor and a second subset of the storage transistors, the second resistor implemented in silicon.

8. The static random access memory of claim 7, wherein storage transistors comprise four transistors configured as two cross-coupled inverters.

9. The static random access memory of claim 7, further comprising:
   the word line coupled to a gate of the first pass gate transistor;
   a first bit line coupled to the first side of the first pass gate transistor, wherein the first resistor is coupled to the second side of the first pass gate transistor;
   a second bit line coupled to a first side of the second pass gate transistor, wherein the second resistor is coupled to a second side of the second pass gate transistor.

10. The static random access memory of claim 7, wherein the storage transistors comprise:
    a first p-type metal oxide semiconductor (PMOS) transistor coupled to the first voltage source;
    a first n-type metal oxide semiconductor (NMOS) transistor coupled in series with the first PMOS transistor;
    a second PMOS transistor coupled to the first voltage source;
    a second NMOS transistor coupled in series with the second PMOS transistor.

11. The static random access memory of claim 7, wherein at least one of the first and second resistors provides process, voltage, and temperature tracking.

12. The static random access memory of claim 7, wherein the first voltage is less than the third voltage.

13. A method comprising:
    sending, to a first bit line of a static random access memory, a data bit to be written to a storage cell of the static random access memory;
    applying a first voltage value to a word line of the static random access memory that is coupled to a gate of a pass gate transistor of the static random access memory, wherein a first voltage source supplies the first voltage value to the first bit line, the word line, and the pass gate transistor of the static random access memory;
    changing a voltage applied to the storage cell of the static random access memory from a second voltage value to a third voltage value, wherein the third voltage value is less than the second voltage value, wherein the second voltage value is different from the first voltage value, wherein a second voltage source supplies the second and third voltage values;
    discharging a node of the storage cell through (1) a first transistor of the storage cell; (2) a pass gate resistor coupled to the node of storage cell; and (3) the pass gate transistor coupled to the pass gate resistor and to the bit line, wherein the data bit is written to the storage cell, and wherein the pass gate transistor operates in a linear region as the node of the storage cell is discharged.

14. The method of claim 13, wherein the storage cell comprises four transistors configured as two cross-coupled inverters.

15. The method of claim 13, wherein the pass gate transistor comprises an n-type metal oxide semiconductor (NMOS) transistor.

16. The method of claim 13, wherein the pass gate resistor provides process, voltage, and temperature tracking.

17. The method of claim 13, wherein the second voltage value is less than the first voltage value.

* * * * *